(12) United States Patent
Hamano

(10) Patent No.: US 12,369,350 B2
(45) Date of Patent: Jul. 22, 2025

(54) **SILICON CARBIDE SEMICONDUCTOR DEVICE WITH A MAIN CELL OUTPUTTING MAIN CURRENT AND A SENSE CELL OUTPUTTING SENSE CURRENT WHEREIN THE INCLINATION OF TEMPERATURE DEPENDENT PROPERTIES OF THE MAIN CURRENT IS APPROXIMATELY FLAT IN A TEMPERATURE OF 0 *C OR LESS**

(71) Applicant: Mitsubishi Electric Corporation, Tokyo (JP)

(72) Inventor: Kenichi Hamano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 628 days.

(21) Appl. No.: 17/713,699

(22) Filed: Apr. 5, 2022

(65) Prior Publication Data
US 2022/0416080 A1 Dec. 29, 2022

(30) Foreign Application Priority Data

Jun. 25, 2021 (JP) .................................. 2021-105756

(51) Int. Cl.
| | | |
|---|---|---|
| H10D 30/66 | (2025.01) | |
| H10D 62/10 | (2025.01) | |
| H10D 62/17 | (2025.01) | |
| H10D 62/832 | (2025.01) | |
| H10D 64/27 | (2025.01) | |

(52) U.S. Cl.
CPC ......... H10D 30/669 (2025.01); H10D 62/127 (2025.01); H10D 62/299 (2025.01);
(Continued)

(58) Field of Classification Search
CPC ............. H01L 29/7815; H01L 29/7802; H01L 29/1608; H01L 29/0696; H01L 29/1095;
(Continued)

(56) References Cited

U.S. PATENT DOCUMENTS

| | | | |
|---|---|---|---|
| 2002/0020873 A1* | 2/2002 | Klodzinski | ......... H01L 29/7395 257/E29.066 |
| 2003/0034522 A1 | 2/2003 | Klodzinski | |

(Continued)

FOREIGN PATENT DOCUMENTS

| | | |
|---|---|---|
| JP | 2004-511084 A | 4/2004 |
| JP | 2011-066121 A | 3/2011 |

(Continued)

OTHER PUBLICATIONS

An Office Action; "Notice of Reasons for Refusal," mailed by the Japanese Patent Office on Mar. 26, 2024, which corresponds to Japanese Patent Application No. 2021-105756 and is related to U.S. Appl. No. 17/713,699; with English language translation.

*Primary Examiner* — Eliseo Ramos Feliciano
*Assistant Examiner* — Brad A Knudson
(74) *Attorney, Agent, or Firm* — Studebaker Brackett PLLC

(57) ABSTRACT

An object of the present disclosure is to achieve a stable current sensing operation and suppress decrease in main current at a low temperature of 0° C. or less in a silicon carbide semiconductor device. An SiC-MOSFET includes: a main cell outputting main current; and a sense cell outputting sense current proportional to the main current, wherein temperature dependent properties of the main current differ in accordance with threshold voltage of the main cell, temperature dependent properties of the sense current differ in accordance with threshold voltage of the sense cell, the threshold voltage of the main cell is smaller than the threshold voltage of the sense cell, and in a temperature of 0° C. or less, an inclination of the temperature dependent properties of the main current is smaller than an inclination of the temperature dependent properties of the sense current.

10 Claims, 3 Drawing Sheets

(52) U.S. Cl.
CPC ....... *H10D 62/393* (2025.01); *H10D 62/8325* (2025.01); *H10D 64/516* (2025.01)

(58) Field of Classification Search
CPC ........... H01L 29/42364; H01L 29/1041; H01L 29/42368; H10D 30/669; H10D 62/127; H10D 62/393; H10D 62/8325; H10D 62/292; H10D 64/514
See application file for complete search history.

(56) References Cited

U.S. PATENT DOCUMENTS

| | | |
|---|---|---|
| 2011/0062514 A1 | 3/2011 | Takano |
| 2012/0132912 A1* | 5/2012 | Suekawa ............. H01L 29/7804 257/49 |
| 2013/0153900 A1* | 6/2013 | Kinouchi .......... H01L 29/66068 257/48 |
| 2015/0179758 A1 | 6/2015 | Ata |
| 2018/0061980 A1* | 3/2018 | Ohoka ................ H01L 29/7815 |
| 2019/0198656 A1 | 6/2019 | Zhang et al. |
| 2019/0371931 A1 | 12/2019 | Zhang et al. |
| 2021/0384331 A1* | 12/2021 | Sato ................... H01L 29/4238 |

FOREIGN PATENT DOCUMENTS

| | | |
|---|---|---|
| JP | 2017-028236 A | 2/2017 |
| JP | 2017-079324 A | 4/2017 |
| JP | 2021-507531 A | 2/2021 |
| WO | 2014/013618 A1 | 1/2014 |

\* cited by examiner

SILICON CARBIDE SEMICONDUCTOR DEVICE WITH A MAIN CELL OUTPUTTING MAIN CURRENT AND A SENSE CELL OUTPUTTING SENSE CURRENT WHEREIN THE INCLINATION OF TEMPERATURE DEPENDENT PROPERTIES OF THE MAIN CURRENT IS APPROXIMATELY FLAT IN A TEMPERATURE OF 0 *C OR LESS

BACKGROUND OF THE INVENTION

Field of the Invention

The present disclosure relates to a silicon carbide (also referred to as SiC hereinafter) semiconductor device.

Description of the Background Art

International Publication No. 2014/013618 discloses a semiconductor device in which a main cell outputting main current (also referred to as main current) and a sense cell outputting sense current proportional to the main current are provided in the same semiconductor substrate. In the semiconductor device in International Publication No. 2014/013618, threshold voltage of the sense cell is larger than threshold voltage of the main cell, thus unbalance of a ratio between the main current and the sense current is suppressed.

SUMMARY

In the semiconductor device in International Publication No. 2014/013618, temperature dependent properties of threshold voltage and saturated current is not considered, thus there is a problem that the main current decreases at a low temperature.

An object of a technique according to the present disclosure is to achieve a stable current sensing operation and suppress decrease in main current at a low temperature.

A silicon carbide semiconductor device according to the present disclosure includes a main cell and a sense cell. The main cell outputs main current. The sense cell outputs sense current proportional to the main current. Temperature dependent properties of the main current differ in accordance with threshold voltage of the main cell. Temperature dependent properties of the sense current differ in accordance with threshold voltage of the sense cell. The threshold voltage of the main cell is smaller than the threshold voltage of the sense cell. In a temperature of 0° C. or less, an inclination of the temperature dependent properties of the main current is smaller than an inclination of the temperature dependent properties of the sense current.

In the silicon carbide semiconductor device according to the present disclosure, in the temperature of 0° C. or less, the inclination of the temperature dependent properties of the main current is smaller than the inclination of the temperature dependent properties of the sense current, thus the decrease in the main current at the low temperature can be prevented, and the sense current is reduced and a stable current sensing operation can be achieved.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Embodiment 1

In the present specification, with respect to a conductivity type of a semiconductor layer, a first conductivity type is an n type, and a second conductivity type is a p type. However, a conductivity type may be replaced in a configuration described hereinafter. That is to say, the first conductivity type may be a p type, and the second conductivity type may be an n type.

<A-1. Configuration>

Figure 1:
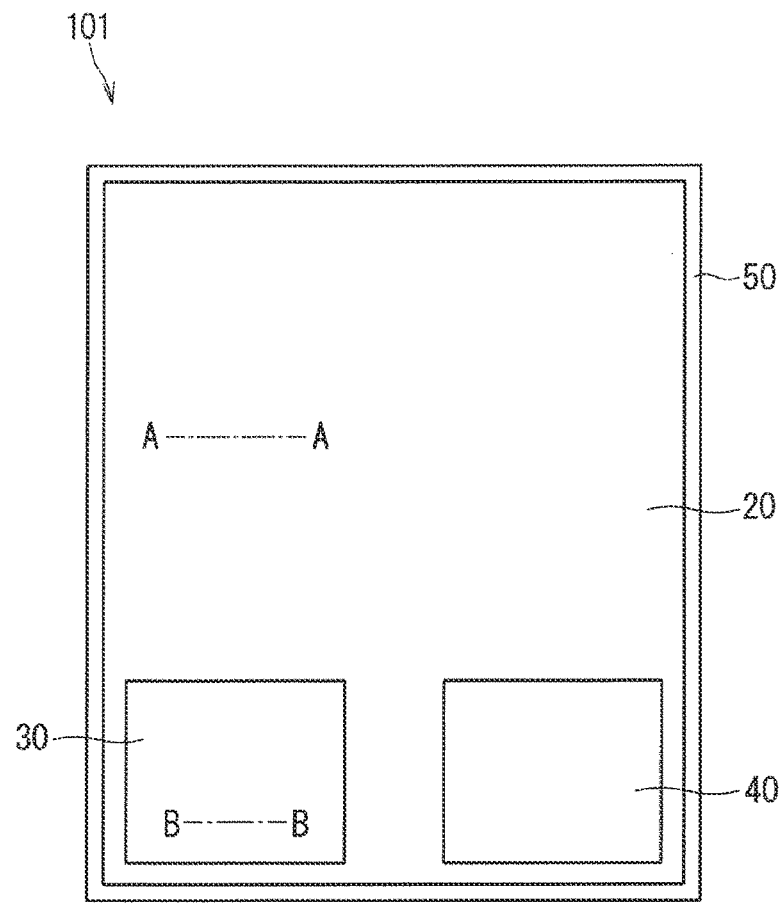
FIG. 1 is a top view of an SiC-MOSFET according to an embodiment 1.

FIG. 1 is a top view of an SiC metal oxide semiconductor field effect transistor (MOSFET) 101 as a silicon carbide semiconductor device according to an embodiment 1. In the present specification, a MOSFET using SiC as a semiconductor material is referred to as an SiC-MOSFET. The MOSFET is described in the present specification, however, a technique according to the present disclosure can be applied to the other semiconductor device such as an insulated gate bipolar transistor (IGBT), for example.

As illustrated in FIG. 1, the SiC-MOSFET 101 includes a main cell 20, a sense cell 30, a terminal region 50, and a gate pad 40. The main cell 20 is a region in which a semiconductor element structure is formed to operate as a semiconductor element. That is to say, a MOSFET structure is formed in the main cell 20, and operates as a MOSFET. The terminal region 50 is provided to surround the main cell 20, the sense cell 30, and the gate pad 40, and has a role of holding withstand voltage of the SiC-MOSFET 101. A gate electrode of the main cell 20 is connected to the gate pad 40, and the gate pad 40 controls current flowing in the main cell 20. The sense cell 30 is a control cell for detecting current flowing in the main cell 20. The sense cell 30 is electrically connected to a part of the main cell 20, thus when current flows in the main cell 20, one severalth to one several-tens-thousandth of current flowing in the whole main cell 20 flows in the sense cell 30. A plurality of sense cells 30 may be provided, or only one sense cell 30 may also be provided.

Figure 2:
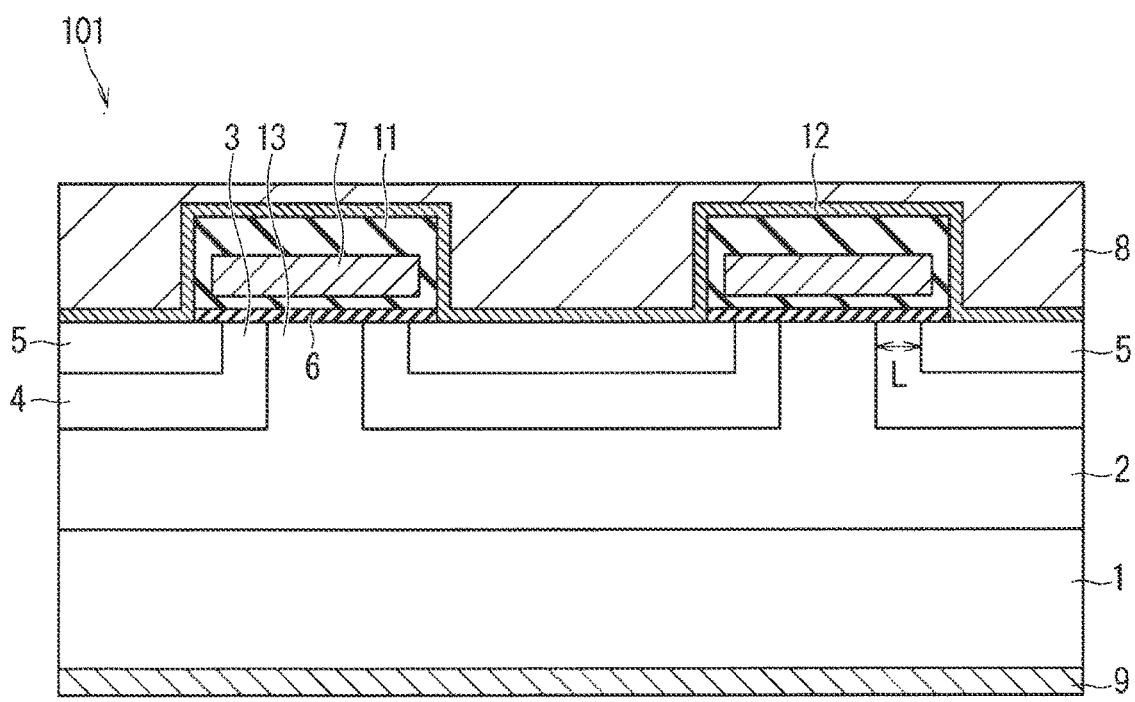
FIG. 2 is a cross-sectional view of the SiC-MOSFET according to the embodiment 1.

FIG. 2 is a cross-sectional view of the main cell 20 of the SiC-MOSFET 101 along an A-A line in FIG. 1. As illustrated in FIG. 2, the SiC-MOSFET 101 includes an n-type SiC substrate 1, an n-type epitaxial layer 2, a p-type base region 4, an n-type source region 5, a gate oxide film 6, a gate electrode 7, an interlayer insulating film 11, a barrier metal 12, a source electrode 8, and a drain electrode 9. The SiC-MOSFET 101 has a planar structure. The epitaxial layer 2 is provided on an upper surface of the SiC substrate 1. The plurality of base regions 4 are provided separately on a surface layer of the epitaxial layer 2. The source region 5 as an impurity region is provided on a surface layer of each base region 4. The surface layer of the epitaxial layer 2 sandwiched between two base regions 4 is referred to as a JFET region 13. The base region 4 sandwiched between the JFET region 13 and the source region 5 functions as a channel region 3. In FIG. 2, a length of the channel region 3 (referred to as a channel length hereinafter) is expressed by L.

A gate oxide film 6 is provided on the channel region 3. The gate electrode 7 is provided in a position facing the channel region 3 via the gate oxide film 6. The gate electrode 7 is covered by the interlayer insulating film 11. A barrier metal 12 is provided on the source region 5 and the interlayer insulating film 11. The source electrode 8 as an upper surface electrode is provided on the barrier metal 12. The drain electrode 9 is provided on a lower surface of the SiC substrate 1.

A cross-sectional structure of the sense cell 30 along a B-B line in FIG. 1 is also similar to a cross-sectional structure of the main cell 20 illustrated in FIG. 2 other than an adjustment structure of threshold voltage described hereinafter, and is formed by a known manufacturing method.

Figure 3:
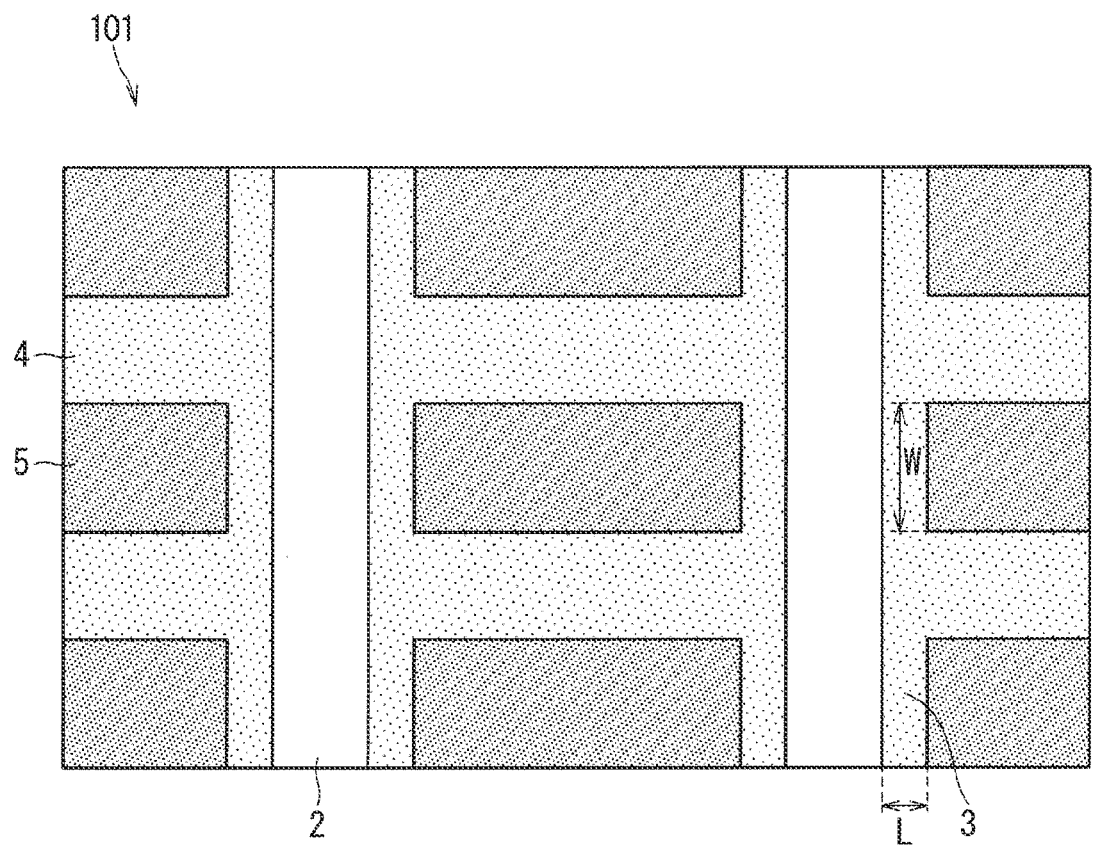
FIG. 3 is a top view of the SiC-MOSFET according to the embodiment 1.

FIG. 3 is a diagram illustrating a planar positional relationship between the epitaxial layer 2, the base region 4, and the source region 5 in the SiC-MOSFET 101. In FIG. 3, a width of the channel region 3 (referred to as a channel width hereinafter) is expressed by W, and the channel length is expressed by L.

<A-2. Threshold Voltage of Main Cell and Sense Cell>

Figure 4:
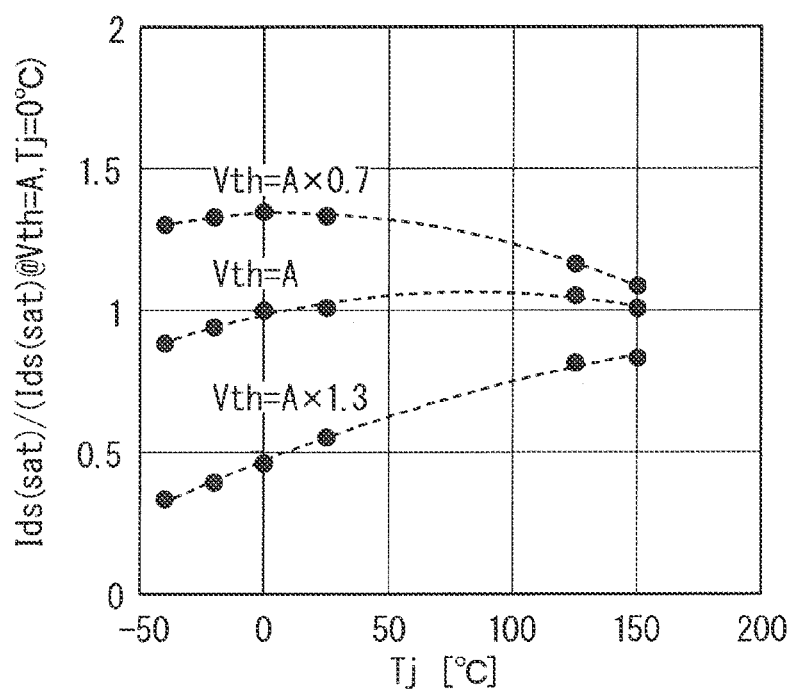
FIG. 4 is a diagram illustrating temperature dependent properties of saturated drain current with respect to plural types of threshold voltage.

FIG. 4 illustrates temperature dependent properties of saturated drain current Ids (sat) in an SiC-MOSFET. In FIG. 4, a lateral axis expresses a junction temperature Tj [° C.], and a vertical axis expresses saturated drain current Ids (sat). Drain voltage Vd is 10V and gate voltage Vg is 15V. Herein, threshold voltage Vth of the gate voltage in a case where the saturated drain current Ids (sat) at the junction temperature Tj=0° C. has the same value as the saturated drain current Ids (sat) at the junction temperature Tj=150° C. is set to A. In the vertical axis in FIG. 4, the saturated drain current Ids (sat) is normalized so that the saturated drain current Ids (sat) at the threshold voltage Vth=A and Tj=0° C. is 1.

A devisor of the technique according to the present disclosure prepared three SiC-MOSFETs having different types of threshold voltage of Vth=A, Vth=A×0.7, and Vth=A×1.3, respectively, and measured the saturated drain current Ids (sat) with the different junction temperatures Tj, thereby obtaining a result in FIG. 4. Newly found from the result in FIG. 4 is that the temperature dependent properties of the saturated drain current Ids (sat) differ depending on the threshold voltage Vth. In a wide bandgap semiconductor such as SiC, the drift layer can be thinned compared with Si, thus a ratio of channel resistance to total resistance is large. As a result, it is considered that the temperature dependent properties of the saturated drain current Ids (sat) significantly fluctuates in accordance with the change of the threshold voltage Vth, and the result in FIG. 4 is obtained.

In the semiconductor device described in International Publication No. 2014/013618, the threshold voltage of the sense cell is set to be larger than that of the main cell. However, in International Publication No. 2014/013618, the change of the temperature dependent properties of the saturated drain current depending on the threshold voltage illustrated in FIG. 4 is not considered. Thus, there is a problem that the saturated drain current decreases at a low temperature depending on the threshold voltage of the main cell.

Thus, in the SiC-MOSFET 101 according to the present embodiment, the threshold voltage differs between the main cell 20 and the sense cell 30 in consideration of the temperature dependent properties of the saturated drain current Ids (sat), thus a stable current sensing operation is achieved and decrease in the main current at a low temperature of 0° C. or less is suppressed. Details thereof are described hereinafter.

FIG. 4 shows that the saturated drain current Ids (sat) tends not decrease even at a low temperature of 0° C. or less as the threshold voltage gets small. When the threshold voltage of the main cell 20 is larger than threshold voltage A, the main current decreases at a low temperature. Accordingly, the threshold voltage of the main cell 20 is preferably smaller than the threshold voltage A. Accordingly, an inclination of the temperature dependent properties of the main current is approximately flat at a low temperature of 0° C. or less. The inclination of the temperature dependent properties is obtained by dividing a change amount of the saturated drain current by a change amount of the junction temperature.

The threshold voltage of the sense cell 30 is preferably larger than the threshold voltage of the main cell 20. The reason is that the saturated drain current hardly decreases even at a low temperature of 0° C. or less as the threshold voltage gets small, thus when the threshold voltage of the sense cell 30 is smaller than that of the main cell 20, an excess overcurrent protection occurs and a stable current sensing operation cannot be achieved. When the threshold voltage of the sense cell 30 is the same as that of the main cell 20, an excess overcurrent protection may occur due to surge current. Accordingly, it is preferable that the threshold voltage of the sense cell 30 is set to A, and the threshold voltage of the main cell 20 is set to be smaller than the threshold voltage A of the sense cell 30 such as A×0.7, for example, to suppress the decrease in the main current while avoiding the excess overcurrent protection at a low temperature of 0° C. or less. That is to say, the inclination of the temperature dependent properties of the sense current is larger than the inclination of the temperature dependent properties of the main current at a low temperature of 0° C. or less.

When the threshold voltage Vth of the main cell 20 is Vth=A×0.7, the temperature properties of the saturated drain current of the main cell 20 is approximately flat at a low temperature of 0° C. or less. Herein a state of approximately flat means that Ids (sat) at a temperature of −40° C. is equal to or larger than 90% and equal to or smaller than 100% of Ids (sat) at a temperature of 0° C. At a high temperature higher than 0° C., plus and minus of an inclination of a graph of the temperature dependent properties of the saturated drain current tends to be reversed in cases where the threshold voltage Vth is smaller and larger than A. Also at a high temperature, in consideration of a stable current sensing operation, the threshold voltage of the main cell 20 is preferably set to be smaller than the threshold voltage A of the sense cell 30 such as A×0.7, for example, so that the plus and minus of the inclination of the graph of the temperature dependent properties is not reversed.

<A-3. Manufacturing Process>

A process of manufacturing the SiC-MOSFET 101 is described.

Firstly, an SiC epitaxial wafer of 4H type is prepared as the n-type SiC substrate 1. The SiC epitaxial wafer of 4H type has a <0001> axis as a crystal axis with an inclination of 4° with respect to a surface of the wafer. The n-type epitaxial layer 2 is formed on the SiC substrate 1. A mask is formed by resist, for example, in separated portions in the epitaxial layer 2 at predetermined intervals, and impurity is ion-implanted to form a pair of p-type base regions 4. Examples of p-type impurity in the epitaxial layer 2 include boron (B) or aluminum (Al), for example.

Furthermore, a mask is formed by resist, for example, in each base region 4, and impurity is ion-implanted to form the n-type source region 5 on a surface layer of the base region 4. Subsequently, the mask is removed. Examples of the n-type impurity include phosphorus (P) or nitrogen (N). The base region 4 between the surface layer of the epitaxial layer 2 where the base region 4 is not formed and the source region 5 functions as the channel region 3.

Next, the wafer is thermally processed at a high temperature by a thermal treatment apparatus, thus n-type ions and p-type ions which have been already implanted are electrically activated.

Subsequently, the gate oxide film 6 is formed by thermal oxidation or deposition. The gate electrode 7 is formed and patterned on the gate oxide film 6. The gate electrode 7 is patterned so that a pair of base region 4 and the source region 5 are located on both ends of the gate electrode 7, and the epitaxial layer 2 exposed between the pair of base regions 4 is located in a center of the gate electrode 7.

Next, a remaining part of the gate oxide film 6 on each source region 5 is removed by a lithography technique and an etching technique. Subsequently, the source electrode 8 is formed and patterned on the source region 5 exposed from the gate oxide film 6.

Subsequently, the drain electrode 9 is formed on the lower surface of the SiC substrate 1. In this manner, the structure of the main cell 20 and the sense cell 30 of the SiC-MOSFET 101 is obtained. The lower surface of the SiC substrate 1 may be polished or ground to be thinned before forming the drain electrode 9.

<A-4. Adjustment Structure of Threshold Voltage>

As described above, the threshold voltage of the main cell 20 is set to be smaller than that of the sense cell 30 in the SiC-MOSFET 101. For example, it is preferable that when the sense cell 30 has the threshold voltage A, the main cell 20 has threshold voltage of A×0.7. Described hereinafter is a configuration that the threshold voltage of the main cell 20 is set to be smaller than that of the sense cell 30.

The whole resistance in conducting current in the SiC-MOSFET 101 is made up of a sum of resistance of the SiC substrate 1, resistance of the epitaxial layer 2, resistance of the JFET region, and resistance of the channel region 3 (referred to as the channel resistance hereinafter). When a ratio of the channel resistance to the whole resistance in conducting the current is changed, the threshold voltage can be changed.

One method of changing the channel resistance is to change W/L as a ratio of the channel width W to the channel length L. When W/L increases, the channel resistance decreases, and the threshold voltage decreases. An opening width of a patterning mask used for ion-implanting the n-type impurity into the base region 4 differs between the main cell 20 the sense cell 30 so that W/L of the main cell 20 is larger than that of the sense cell 30, thus the threshold voltage of the main cell 20 can be set to be smaller than that of the sense cell 30.

The other method of changing the channel resistance is to change an impurity concentration of the channel region 3. The channel resistance decreases as the impurity concentration of the channel region 3 gets small, and the threshold voltage decreases. Accordingly, the opening width of the patterning mask at the time of ion-implanting the n-type impurity into the base region 4 differs between the main cell 20 the sense cell 30 so that the impurity concentration of the channel region 3 in the main cell 20 is smaller than that in the sense cell 30, thus the threshold voltage of the main cell 20 can be set to be smaller than that of the sense cell 30.

The impurity concentration of the channel region 3 may be adjusted by changing an implantation amount of the impurity ion in the base region 4. However, according to this method, the ion implantation needs to be separately performed in the main cell 20 and the sense cell 30, thus the number of processes such as a patterning and an implantation process increases.

The threshold voltage also depends on the impurity concentration of the surface of the channel region 3. In a case of a silicon carbide semiconductor, ions are not diffused in the thermal treatment after the ion implantation due to a difference of a thermal diffusion coefficient compared with an Si semiconductor. Accordingly, a substrate surface of the main cell 20 and the sense cell 30, that is to say, surfaces of the epitaxial layer 2, the base region 4, and the source region 5 are ground by etching processing after the implantation of the ions forming the base region 4 and the source region 5, thus the threshold voltage can be changed.

The threshold voltage decreases as the gate oxide film 6 gets thin. Accordingly, when the gate oxide film 6 of the sense cell 30 is thicker than the gate oxide film 6 of the main cell 20, the threshold voltage of the main cell 20 may be smaller than that of the sense cell 30.

Figure 5:
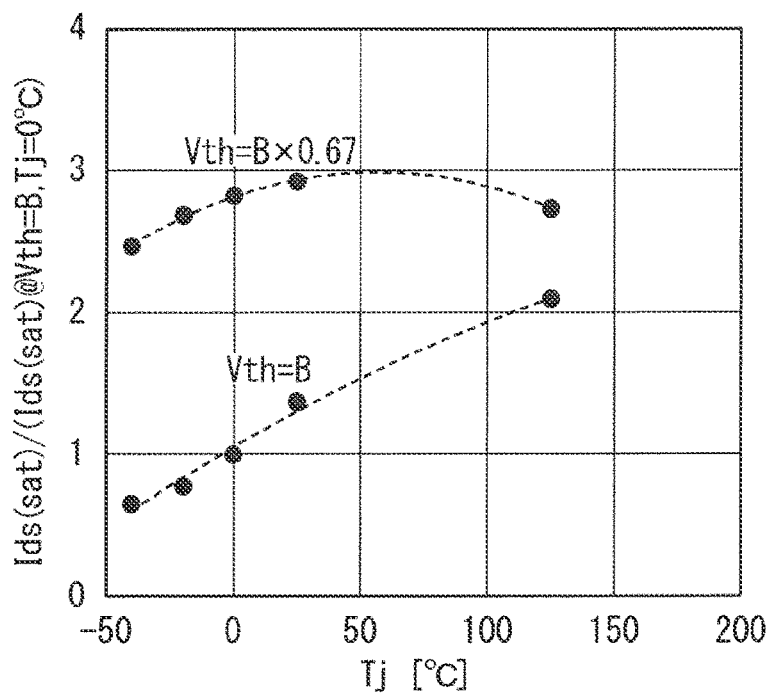
FIG. 5 is a diagram illustrating temperature dependent properties of saturated drain current with respect to plural types of threshold voltage.

It is also applicable to form a level on an interface of the gate oxide film 6 by a thermal treatment in H2O atmosphere referred to as reoxidation after forming the gate oxide film 6 to increase the threshold voltage. A relationship between the temperature dependent properties of the saturated drain current Ids (sat) and the threshold voltage Vth in a case of applying a reoxidation process is as illustrated in FIG. 5, and has the same inclination as a case of not performing the reoxidation process illustrated in FIG. 4. FIG. 5 illustrates a result of measuring the saturated drain current Ids (sat) with different junction temperatures Tj for two SiC-MOSFETs having different types of threshold voltage of Vth=B and Vth=B×0.67, respectively.

A thickness of a metal film made up of the source electrode 8 and the barrier metal 12 differs between the main cell 20 and the sense cell 30, thus stress applied to each cell can be changed, and the threshold voltage can be changed. The metal film in the sense cell 30 is thicker than the metal film in the main cell 20, thus the threshold voltage of the main cell 20 can be set to be smaller than that of the sense cell 30.

In FIG. 2, the barrier metal 12 is provided on whole upper surfaces of the interlayer insulating film 11 and the source region 5. However, the barrier metal 12 may be partially provided thereon, such as only a periphery of the interlayer insulating film 11, for example. The barrier metal 12 has a laminated structure made up of a plurality of layers. A material of the barrier metal 12 may be different between the main cell 20 and the sense cell 30. The barrier metal 12 is made of Ti or TiN, for example, and the source electrode 8 is Al or AlSi, for example.

A-5. Modification Example

Figure 6:
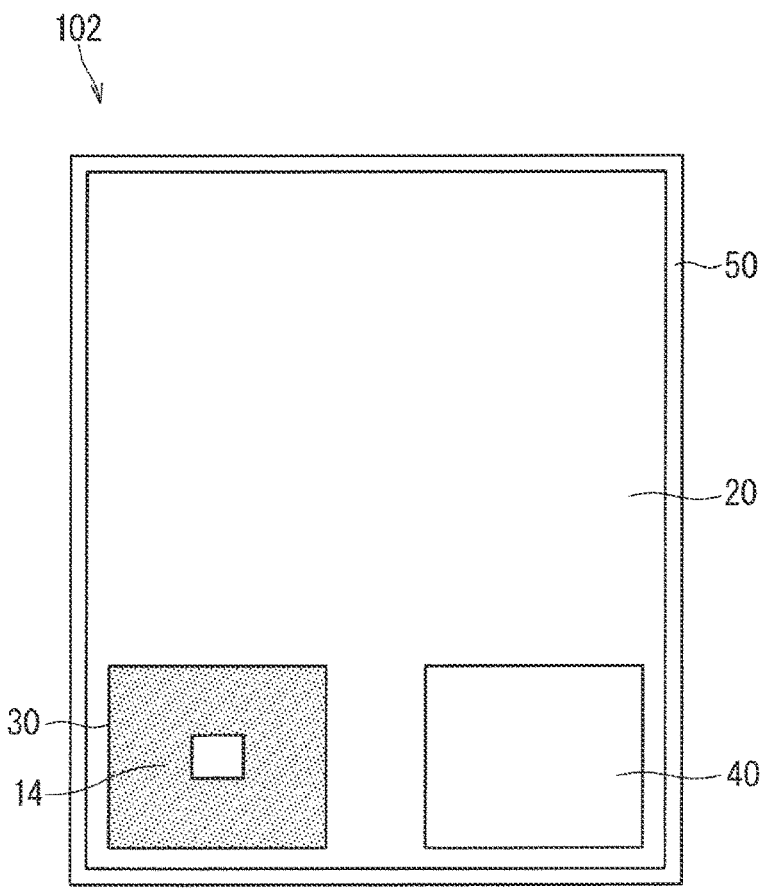
FIG. 6 is a top view of an SiC-MOSFET according to a modification example of the embodiment 1.

FIG. 6 is a top view of an SiC-MOSFET 102 as a silicon carbide semiconductor device according to a modification example of the embodiment 1. The SiC-MOSFET 102 has a configuration similar to the SiC-MOSFET 101 except that a surface electrode protection film 14 is provided on the source electrode 8 of the sense cell 30. Stress applied to the cell changes in accordance with presence or absence of the surface electrode protection film 14, and the threshold voltage changes. As illustrated in FIG. 6, the surface electrode protection film 14 is provided only on the source electrode 8 of the sense cell 30, and a surface electrode protection film is not formed on the source electrode 8 of the main cell 20, thus the threshold voltage of the main cell 20 is smaller than that of the sense cell 30.

The surface electrode protection film 14 may be provided on the source electrode 8 of the main cell 20, however, in such a case, an area of the surface electrode protection film 14 in the sense cell 30 is set to be larger than that of the surface electrode protection film 14 in the main cell 20. Accordingly, the threshold voltage of the main cell 20 is smaller than that of the sense cell 30. The surface electrode protection film 14 is polyimide (PI) or glass coating (GC), for example.

In changing the stress applied to the cell, the configuration of changing the thickness of the metal film and the configuration regarding the arrangement of the surface electrode protection film 14 described above may be combined with each other.

<A-6. Effect>

The SiC-MOSFET 101 according to the embodiment 1 includes the main cell 20 outputting the main current and the sense cell 30 outputting the sense current proportional to the main current. The temperature dependent properties of the main current differ in accordance with the threshold voltage of the main cell, and the temperature dependent properties of the sense current differ in accordance with the threshold voltage of the sense cell. In a temperature of 0° C. or less, the inclination of the temperature dependent properties of the main current is approximately flat. Accordingly, decrease in the main current at a low temperature can be prevented. The threshold voltage of the main cell 20 is smaller than that of the sense cell 30, and the inclination of the temperature dependent properties of the main current is smaller than that of the temperature dependent properties of the sense current at a temperature of 0° C. or less. Accordingly, the sense current can be reduced at a low temperature of 0° C. or less, and a stable current sensing operation can be achieved.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A silicon carbide semiconductor device, comprising:
   a main cell outputting main current; and
   a sense cell outputting sense current proportional to the main current, wherein
   temperature dependent properties of the main current differ in accordance with threshold voltage of the main cell,
   temperature dependent properties of the sense current differ in accordance with threshold voltage of the sense cell,
   the threshold voltage of the main cell is smaller than the threshold voltage of the sense cell, and
   in a temperature of 0° C. or less, an inclination of the temperature dependent properties of the main current is smaller than an inclination of the temperature dependent properties of the sense current, and
   the threshold voltage of the main cell is set such that, in a temperature of 0° C. or less, the inclination of the temperature dependent properties of the main current is approximately flat such that the main current of the main cell at a temperature of −40° C. is equal to or larger than 90% and equal to or smaller than 100% of the main current of the main cell at a temperature of 0° C.

2. The silicon carbide semiconductor device according to claim 1, wherein the main cell and the sense cell includes:
   a silicon carbide substrate;
   an epitaxial layer of a first conductivity type provided on a silicon carbide substrate;
   a base region of a second conductivity type provided on a surface layer of the epitaxial layer;
   an impurity region selectively provided on a surface layer of the base region to define a region of the base region sandwiched between the impurity region and the epitaxial layer as a channel region;
   a gate electrode facing the channel region via a gate oxide film;
   an interlayer insulating film covering the gate electrode;
   a barrier metal formed on the interlayer insulating film; and
   an upper surface electrode covering the barrier metal.

3. The silicon carbide semiconductor device according to claim 2, wherein
   resistance of the channel region in the main cell is smaller than resistance of the channel region in the sense cell.

4. The silicon carbide semiconductor device according to claim 3, wherein
   a ratio of a channel width to a channel length of the channel region in the main cell is larger than a ratio of a channel width to a channel length of the channel region in the sense cell.

5. The silicon carbide semiconductor device according to claim 3, wherein
   an impurity concentration of the channel region in the main cell is smaller than an impurity concentration of the channel region in the sense cell.

6. The silicon carbide semiconductor device according to claim 2, wherein
   the gate oxide film of the sense cell is thicker than the gate oxide film of the main cell.

7. The silicon carbide semiconductor device according to claim 2, wherein
   a sum of thicknesses of the barrier metal and the upper surface electrode is larger in the sense cell than in the main cell.

8. The silicon carbide semiconductor device according to claim 2, wherein
   the barrier metal is Ti or TiN, and
   the upper surface electrode is Al or AlSi.

9. The silicon carbide semiconductor device according to claim 2, further comprising
   a surface electrode protection film provided on the upper surface electrode in the main cell and the sense cell, wherein an area of the surface electrode protection film is larger in the sense cell than in the main cell.

10. The silicon carbide semiconductor device according to claim 2, further comprising
a surface electrode protection film provided only on the upper surface electrode of the sense cell.

* * * * *